US009685688B2

(12) United States Patent
Katabuchi et al.

(10) Patent No.: US 9,685,688 B2
(45) Date of Patent: Jun. 20, 2017

(54) DIRECTIONAL COUPLER

(71) Applicant: Murata Manufacturing Co., Ltd., Kyoto (JP)

(72) Inventors: Keisuke Katabuchi, Kyoto (JP); Tetsuo Taniguchi, Kyoto (JP); Yasushi Yunoki, Kyoto (JP)

(73) Assignee: MURATA MANUFACTURING CO., LTD, Kyoto (JP)

( * ) Notice: Subject to any disclaimer, the term of this patent is extended or adjusted under 35 U.S.C. 154(b) by 9 days.

(21) Appl. No.: 14/800,196

(22) Filed: Jul. 15, 2015

(65) Prior Publication Data

US 2016/0028145 A1 Jan. 28, 2016

(30) Foreign Application Priority Data

Jul. 23, 2014 (JP) ................................ 2014-149703

(51) Int. Cl.
*H01P 5/18* (2006.01)
*H03H 7/38* (2006.01)

(52) U.S. Cl.
CPC .................................. *H01P 5/184* (2013.01)

(58) Field of Classification Search
CPC .................................. H01P 5/18; H01P 5/184
USPC .......................................... 333/109–112, 116
See application file for complete search history.

(56) References Cited

U.S. PATENT DOCUMENTS

| | | | |
|---|---|---|---|
| 4,264,881 A * | 4/1981 | De Ronde | H01P 7/082 331/107 SL |
| 5,841,328 A | 11/1998 | Hayashi | |
| 7,253,701 B2 * | 8/2007 | Smith | H01P 1/2135 333/100 |
| 8,044,749 B1 | 10/2011 | Witas et al. | |
| 9,331,372 B2 * | 5/2016 | Fackelmeier | H01P 5/18 |
| 2016/0028144 A1 * | 1/2016 | Katabuchi | H01P 5/187 333/116 |

FOREIGN PATENT DOCUMENTS

| | | | |
|---|---|---|---|
| DE | 102012221913 A1 * | 6/2014 | H01P 1/185 |
| JP | 3203253 B2 | 8/2001 | |
| JP | 2006081018 A | 3/2006 | |
| JP | 2013021437 A | 1/2013 | |

OTHER PUBLICATIONS

Office action issued in JP2014-149703 dated Mar. 22, 2017.

* cited by examiner

*Primary Examiner* — Dean Takaoka
(74) *Attorney, Agent, or Firm* — Pearne & Gordon LLP

(57) ABSTRACT

A directional coupler includes a main line, a sub line, and a first parasitic element. The main line includes a first main line portion. The sub line includes a first sub line portion electromagnetically coupled with the first main line portion. The first parasitic element receives a first magnetic flux which is generated by the first main line portion when a current flows through the first main line portion and generates a second magnetic flux passing through the first sub line portion due to electromagnetic induction.

19 Claims, 10 Drawing Sheets

DIRECTIONAL COUPLER

BACKGROUND OF THE DISCLOSURE

1. Field of the Disclosure

The present disclosure relates to a directional coupler, and more particularly, to a directional coupler including a main line and a sub line electromagnetically coupled with each other.

2. Description of the Related Art

As an example of directional couplers of the related art, the directional coupler disclosed in Japanese Patent No. 3203253 is known. This directional coupler includes first and second coupling lines formed in a spiral shape. The first and second coupling lines are superposed on each other in the vertical (top-bottom) direction and are electromagnetically coupled with each other. With this configuration, the first coupling line serves as a main line, while the second coupling line serves as a sub line.

In the directional coupler disclosed in this publication, there may be a case in which adjustment is desirably made so as to reduce the degree of coupling between the first coupling line (main line) and the second coupling line (sub line). This can be realized by increasing the vertical distance between the first and second coupling lines. This, however, increases the height of the directional coupler. Thus, in the directional coupler disclosed in this publication, it is difficult to reduce the degree of coupling between the main line and the sub line while implementing a decreased thickness of the directional coupler.

BRIEF SUMMARY OF THE DISCLOSURE

Accordingly, it is an object of the present disclosure to provide a directional coupler in which the degree of coupling between a main line and a sub line can be reduced while a decreased thickness of the directional coupler is implemented.

According to preferred embodiments of the present disclosure, there is provided a directional coupler including a main line, a sub line, and a first parasitic element. The main line includes a first main line portion. The sub line includes a first sub line portion electromagnetically coupled with the first main line portion. The first parasitic element receives a first magnetic flux generated by the first main line portion when a current flows through the first main line portion and generates a second magnetic flux passing through the first sub line portion due to electromagnetic induction.

According to the preferred embodiments of the present disclosure, it is possible to reduce the degree of coupling between a main line and a sub line of a directional coupler while a decreased thickness of the directional coupler is implemented.

Other features, elements, characteristics and advantages of the present disclosure will become more apparent from the following detailed description of the preferred embodiments of the present disclosure with reference to the attached drawings.

DETAILED DESCRIPTION OF THE DISCLOSURE (First Embodiment)

Figure 1:
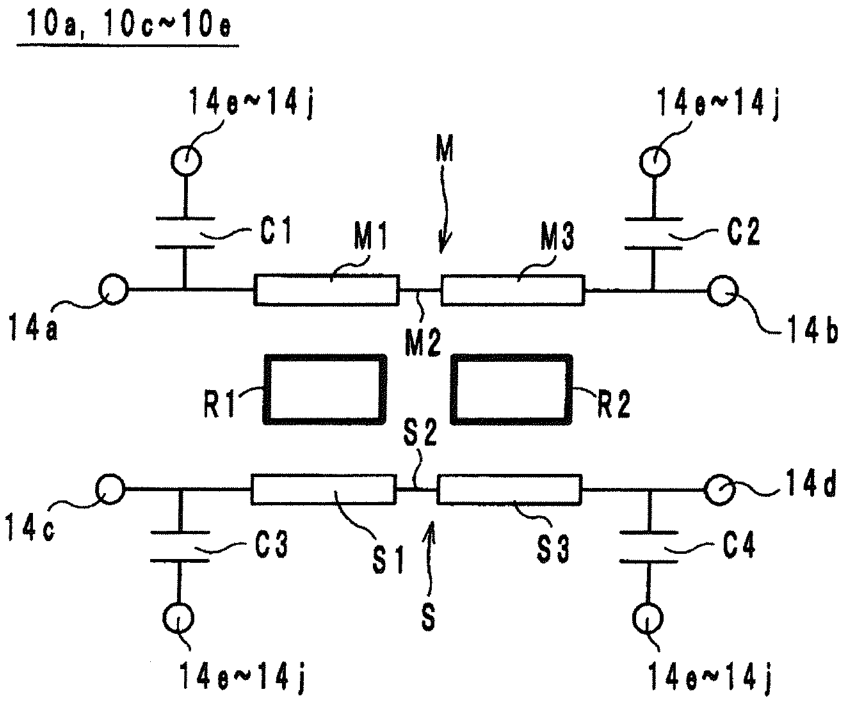
FIG. 1 is an equivalent circuit diagram of a directional coupler.

A directional coupler 10*a* according to a first embodiment will be described below with reference to FIGS. 1 through 4B. FIG. 1 is an equivalent circuit diagram of each of directional couplers 10*a* and 10*c* through 10*e*.

The circuit configuration of the directional coupler 10*a* will be described. The directional coupler 10*a* is used in a predetermined frequency band, for example, a frequency band (for example, 698 to 3800 MHz) in which long term evolution (LTE) is used.

As the circuit configuration, the directional coupler 10*a* includes outer electrodes 14*a* through 14*j*, a main line M, a sub line S, capacitors C1 through C4, and ring conductors R1 and R2. The main line M is connected between the outer electrodes 14*a* and 14*b* and includes main line portions M1 and M3 and an intermediate line portion M2. The main line portion M1, the intermediate line portion M2, and the main line portion M3 are connected in series with each other in this order between the outer electrodes 14*a* and 14*b*.

The sub line S is connected between the outer electrodes 14*c* and 14*d* and includes sub line portions S1 and S3 and an intermediate line portion S2. The sub line portion S1, the intermediate line portion S2, and the sub line portion S3 are connected in series with each other in this order between the outer electrodes 14*c* and 14*d*.

The main line portion M1 and the sub line portion S1 are electromagnetically coupled with each other. The main line portion M3 and the sub line portion S3 are also electromagnetically coupled with each other.

The capacitor C1 is connected between the outer electrode 14*a* and the outer electrodes 14*e* through 14*j*. The capacitor C2 is connected between the outer electrode 14*b* and the outer electrodes 14*e* through 14*j*. The capacitor C3 is connected between the outer electrode 14*c* and the outer electrodes 14*e* through 14*j*. The capacitor C4 is connected between the outer electrode 14*d* and the outer electrodes 14*e* through 14*j*.

The ring conductor R1 is a ring-shaped conductor layer, and is a parasitic element serving in the following manner. The ring conductor R1 receives magnetic flux $\phi$1 which is generated by the main line portion M1 when a current flows through the main line portion M1, and then generates magnetic flux $\phi$2 passing through the sub line portion S1 due to electromagnetic induction. The function of the ring conductor R1 will be discussed more specifically. The ring conductor R1 is disposed between the main line portion M1 and the sub line portion S1. When a current flows through the main line portion M1, the magnetic flux ϕ1 is generated in the main line portion M1 and then passes through the ring conductor R1. Since the ring conductor R1 is a parasitic element, it does not have a specific potential, and the potential of the ring conductor R1 is stray potential. Accordingly, a current is generated in the ring conductor R1 due to electromagnetic induction, thereby generating the magnetic flux ϕ2 around the ring conductor R1. The magnetic flux ϕ2 then passes through the sub line portion S1. This magnetic flux ϕ2 is generated due to electromagnetic induction so as to cancel out a change in the magnetic flux ϕ1. Thus, the ring conductor R1 serves to reduce the degree of coupling between the main line portion M1 and the sub line portion S1.

The ring conductor R2 is a ring-shaped conductor layer, and is a parasitic element serving in the following manner. The ring conductor R2 receives magnetic flux ϕ3 which is generated by the main line portion M3 when a current flows through the main line portion M3, and then generates magnetic flux ϕ4 passing through the sub line portion S3 due to electromagnetic induction. The ring conductor R2 is disposed between the main line portion M3 and the sub line portion S3. The function of the ring conductor R2 will be discussed more specifically. When a current flows through the main line portion M3, the magnetic flux ϕ3 is generated in the main line portion M3 and then passes through the ring conductor R2. Since the ring conductor R2 is a parasitic element, it does not have a specific potential, and the potential of the ring conductor R2 is stray potential. Accordingly, a current is generated in the ring conductor R2 due to electromagnetic induction, thereby generating the magnetic flux ϕ4 around the ring conductor R2. The magnetic flux ϕ4 then passes through the sub line portion S3. This magnetic flux ϕ4 is generated due to electromagnetic induction so as to cancel out a change in the magnetic flux ϕ3. Thus, the ring conductor R2 serves to reduce the degree of coupling between the main line portion M3 and the sub line portion S3.

In the directional coupler 10*a* configured as described above, the outer electrode 14*a* is used as an input port, while the outer electrode 14*b* is used as an output port. The outer electrode 14*c* is used as a coupling port. The outer electrode 14*d* is used as a terminate port which is terminated at about 50Ω. The outer electrodes 14*e* through 14*j* are used as ground ports which are grounded. When a high-frequency signal is input into the outer electrode 14*a*, it is output from the outer electrode 14*b*. Since the main line M and the sub line S are electromagnetically coupled with each other, a high-frequency signal having a power proportional to the power of a high-frequency signal output from the outer electrode 14*b* is output from the outer electrode 14*c*.

Figure 2:
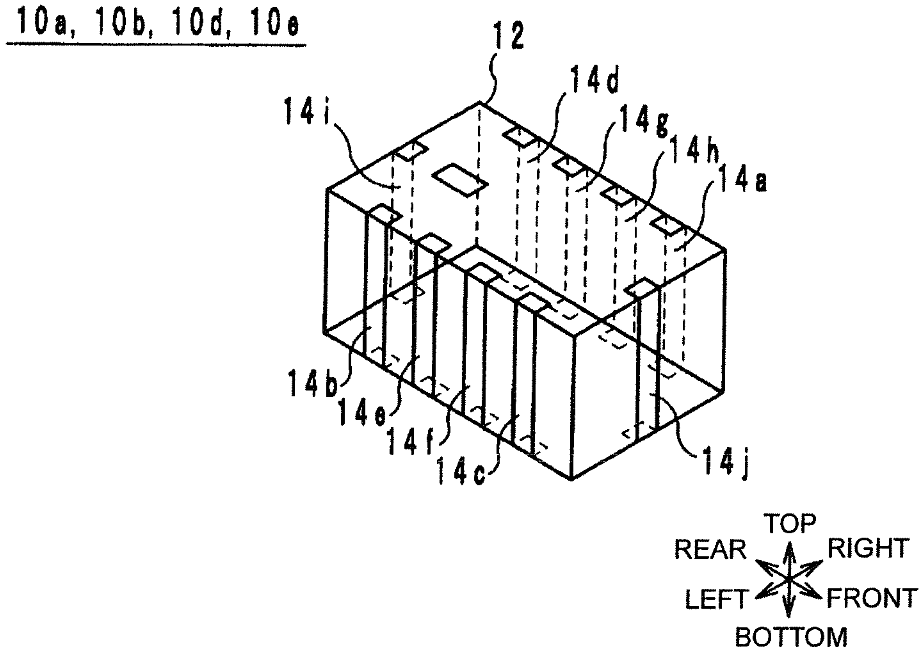
FIG. 2 is an external perspective view of a directional coupler.
Figure 3:
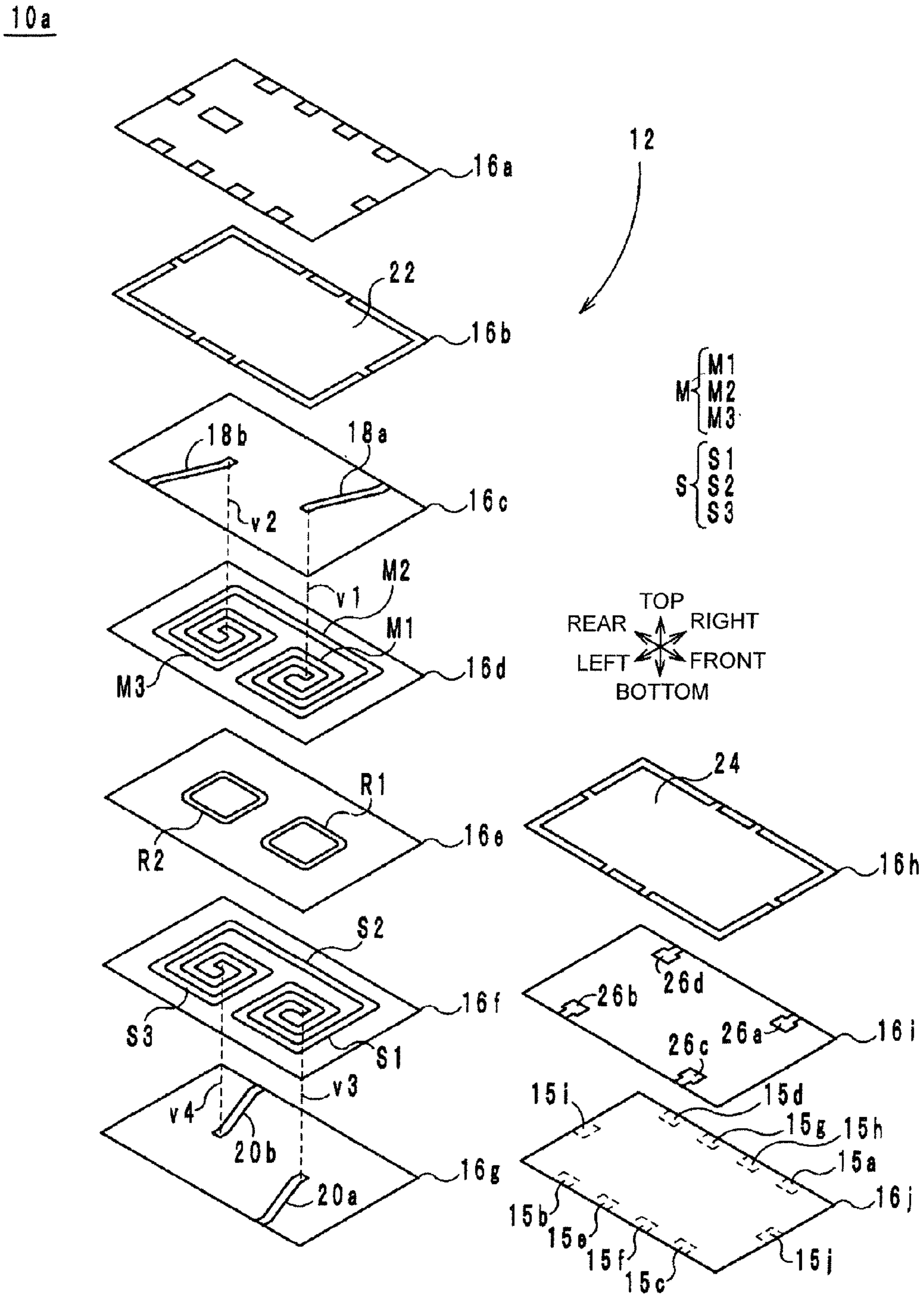
FIG. 3 is an exploded perspective view of a multilayer body of a directional coupler according to a first embodiment.

An example of the specific configuration of the directional coupler 10*a* according to the first embodiment will be discussed below with reference to FIGS. 2 and 3. FIG. 2 is an external perspective view of each of the directional couplers 10*a*, 10*b*, 10*d*, and 10*e*. FIG. 3 is an exploded perspective view of a multilayer body 12 of the directional coupler 10*a*. Hereinafter, the stacking direction of the multilayer body 12 is defined as the top-bottom direction, the longitudinal direction of the directional coupler 10*a*, as viewed from above, is defined as the front-rear direction, and the widthwise direction of the directional coupler 10*a*, as viewed from above, is defined as the right-left direction.

As shown in FIGS. 2 and 3, the directional coupler 10*a* includes a multilayer body 12, outer electrodes 14*a* through 14*j*, a main line M, a sub line S, ring conductors R1 and R2, extended conductors 18*a*, 18*b*, 20*a*, and 20*b*, ground conductors 22 and 24, capacitor conductors 26*a* through 26*d*, and via-hole conductors v1 through v4.

The multilayer body 12 is formed substantially in a rectangular parallelepiped, as shown in FIG. 2, and is formed by stacking substantially rectangular dielectric layers 16*a* through 16*j* made of dielectric ceramic on each other from the top to the bottom in this order, as shown in FIG. 3. Hereinafter, the top and bottom principal surfaces of the multilayer body 12 will be respectively referred to as the "top surface" and the "bottom surface", the front and rear end surfaces of the multilayer body 12 will be respectively referred to as the "front surface" and the "rear surface", and the right and left side surfaces of the multilayer body 12 will be respectively referred to as the "right surface" and the "left surface". When the directional coupler 10*a* is mounted on a circuit board, the bottom surface of the multilayer body 12 is used as a mount surface opposing the circuit board. The top surfaces of the dielectric layers 16*a* through 16*j* will be referred to as the "front sides", and the bottom surfaces of the dielectric layers 16*a* through 16*j* will be referred to as the "back sides".

The outer electrodes 14*b*, 14*e*, 14*f*, and 14*c* are disposed on the left surface of the multilayer body 12 from the rear to the front in this order. The outer electrodes 14*b*, 14*e*, 14*f*, and 14*c* extend on the left surface in the top-bottom direction and also bend to the top and bottom surfaces.

The outer electrodes 14*d*, 14*g*, 14*h*, and 14*a* are disposed on the right surface of the multilayer body 12 from the rear to the front in this order. The outer electrodes 14*d*, 14*g*, 14*h*, and 14*a* extend on the right surface in the top-bottom direction and also bend to the top and bottom surfaces.

The outer electrode 14*i* extends on the rear surface of the multilayer body 12 in the top-bottom direction and also bends to the top and bottom surfaces. The outer electrode 14*j* extends on the front surface of the multilayer body 12 in the top-bottom direction and also bends to the top and bottom surfaces.

The main line M is disposed within the multilayer body 12 and includes main line portions M1 and M3 and an intermediate line portion M2. The main line portion M1 is a linear conductor layer disposed on the front half of the front side of the dielectric layer 16*d*. The main line portion M1 is a spiral conductor layer which winds counterclockwise through multiple turns from the start point positioned at the center of the front half of the dielectric layer 16*d* to the terminate point positioned near the right front corner of the dielectric layer 16*d*, as viewed from above. Hereinafter, the start point and the terminate point of the main line portion M1 will be respectively referred to as the "upstream end" and the "downstream end". The center of the main line portion M1 is the center of the gravity of the outer edge of the outermost periphery of the main line portion M1 and is also the upstream end of the main line portion M1. Accordingly, the main line portion M1 is formed in a spiral shape moving farther away from the center point while winding around the center point counterclockwise.

The main line portion M3 is a linear conductor layer disposed on the rear half of the front side of the dielectric layer 16*d*. The main line portion M3 is a spiral conductor layer which winds counterclockwise through multiple turns from the start point positioned near the right rear corner of the dielectric layer 16*d* to the terminate point positioned at the center of the rear half of the dielectric layer 16*d*, as viewed from above. Hereinafter, the start point and the terminate point of the main line portion M3 will be respectively referred to as the "upstream end" and the "downstream end". The center of the main line portion M3 is the center of the gravity of the outer edge of the outermost periphery of the main line portion M3 and is also the downstream end of the main line portion M3. Accordingly, the main line portion M3 is formed in a spiral shape moving closer to the center point while winding around the center point counterclockwise.

The main line portions M1 and M3 configured as described above are line-symmetrical with each other about a straight line passing through the center of the dielectric layer 16*d* and extending in the right-left direction.

The intermediate line portion M2 is a linear conductor layer disposed on the front side of the dielectric layer 16*d*. The intermediate line portion M2 connects the downstream end of the main line portion M1 and the upstream end of the main line portion M3 and extends along the right long side of the dielectric layer 16*d*. That is, the intermediate line portion M2 is connected between the first and third main line portions M1 and M3. Accordingly, the main line portions M1 and M3 are electrically connected in series with each other. The main line portions M1 and M3 and the intermediate line portion M2 are formed by applying a conductive paste made of a metal, that is, Cu or Ag, as the main component to the front side of the dielectric layer 16*d*.

The extended conductor 18*a* is a straight linear conductor layer disposed on a higher level than the main line M in the top-bottom direction, and more specifically, on the front side of the dielectric layer 16*c*. One end portion of the extended conductor 18*a* is superposed on the upstream end of the main line portion M1, as viewed from above. The other end portion of the extended conductor 18*a* extends to the right long side of the dielectric layer 16*c* and is connected to the outer electrode 14*a*.

The via-hole conductor v1 passes through the dielectric layer 16*c* in the top-bottom direction and connects the end portion of the extended conductor 18*a* superposed on the upstream end of the main line portion M1 and the upstream end of the main line portion M1.

The extended conductor 18*b* is a straight linear conductor layer disposed on a higher level than the main line M in the top-bottom direction, and more specifically, on the front side of the dielectric layer 16*c*. One end portion of the extended conductor 18*b* is superposed on the downstream end of the main line portion M3, as viewed from above. The other end portion of the extended conductor 18*b* extends to the left long side of the dielectric layer 16*c* and is connected to the outer electrode 14*b*.

The extended conductor 18*b* has substantially the same configuration as the extended conductor 18*a*. More specifically, if the extended conductor 18*b* is rotated by 180° around the center of the dielectric layer 16*c*, it coincides with the extended conductor 18*a*. That is, the extended conductors 18*a* and 18*b* are point-symmetrical with each other about the center of the dielectric layer 16*c*.

The via-hole conductor v2 passes through the dielectric layer 16*c* in the top-bottom direction and connects the end portion of the extended conductor 18*b* superposed on the downstream end of the main line portion M3 and the downstream end of the main line portion M3. With this configuration, the main line M is connected between the outer electrodes 14*a* and 14*b*. The via-hole conductors v1 and v2 are formed by charging a conductive paste made of a metal, that is, Cu or Ag, as the main component into via-holes formed in the dielectric layer 16*c*.

The sub line S is disposed within the multilayer body 12 and includes sub line portions S1 and S3 and an intermediate line portion S2. The sub line S has substantially the same configuration as the main line M, and the sub line S and the main line M are superposed on each other and coincides with each other, as viewed from above.

The sub line portion S1 is a linear conductor layer disposed on the front half of the front side of the dielectric layer 16*f*. The sub line portion S1 is a spiral conductor layer which winds counterclockwise through multiple turns from the start point positioned at the center of the front half of the dielectric layer 16*f* to the terminate point positioned near the right front corner of the dielectric layer 16*f*, as viewed from above. Hereinafter, the start point and the terminate point of the sub line portion S1 will be respectively referred to as the "upstream end" and the "downstream end". The center of the sub line portion S1 is the center of the gravity of the outer edge of the outermost periphery of the sub line portion S1 and is also the upstream end of the sub line portion S1. Accordingly, the sub line portion S1 is formed in a spiral shape moving farther away from the center point while winding around the center point counterclockwise.

The sub line portion S3 is a linear conductor layer disposed on the rear half of the front side of the dielectric layer 16*f*. The sub line portion S3 is a spiral conductor layer which winds counterclockwise through multiple turns from the start point positioned near the right rear corner of the dielectric layer 16*f* to the terminate point positioned at the center of the rear half of the dielectric layer 16*f*, as viewed from above. Hereinafter, the start point and the terminate point of the sub line portion S3 will be respectively referred to as the "upstream end" and the "downstream end". The center of the sub line portion S3 is the center of the gravity of the outer edge of the outermost periphery of the sub line portion S3 and is also the downstream end of the sub line portion S3. Accordingly, the sub line portion S3 is formed in a spiral shape moving closer to the center point while winding around the center point counterclockwise.

The sub line portions S1 and S3 configured as described above are line-symmetrical with each other about a straight line passing through the center of the dielectric layer 16*f* and extending in the right-left direction.

The intermediate line portion S2 is a linear conductor layer disposed on the front side of the dielectric layer 16*f*. The intermediate line portion S2 connects the downstream end of the sub line portion S1 and the upstream end of the sub line portion S3 and extends along the right long side of the dielectric layer 16*f*. That is, the intermediate line portion S2 is connected between the first and third sub line portions S1 and S3. Accordingly, the sub line portions S1 and S3 are electrically connected in series with each other. The sub line portions S1 and S3 and the intermediate line portion S2 are formed by applying a conductive paste made of a metal, that is, Cu or Ag, as the main component to the front side of the dielectric layer 16*f*.

The extended conductor 20*a* is a straight linear conductor layer disposed on a lower level than the sub line S in the top-bottom direction, and more specifically, on the front side of the dielectric layer 16*g*. One end portion of the extended conductor 20*a* is superposed on the upstream end of the sub line portion S1, as viewed from above. The other end portion of the extended conductor 20*a* extends to the left long side of the dielectric layer 16*g* and is connected to the outer electrode 14*c*. The extended conductor 20*a* has substantially the same length as the extended conductor 18*a*.

The via-hole conductor v3 passes through the dielectric layer 16*f* in the top-bottom direction and connects the end portion of the extended conductor 20*a* superposed on the upstream end of the sub line portion S1 and the upstream end of the sub line portion S1.

The extended conductor 20*b* is a straight linear conductor layer disposed on a lower level than the sub line S in the top-bottom direction, and more specifically, on the front side of the dielectric layer 16*g*. One end portion of the extended conductor 20*b* is superposed on the downstream end of the sub line portion S3, as viewed from above. The other end portion of the extended conductor 20*b* extends to the right long side of the dielectric layer 16*g* and is connected to the outer electrode 14*d*. The extended conductor 20*b* has substantially the same length as the extended conductor 18*b*.

The extended conductor 20*b* has substantially the same configuration as the extended conductor 20*a*. More specifically, if the extended conductor 20*b* is rotated by 180° around the center of the dielectric layer 16*g*, it coincides with the extended conductor 20*a*. That is, the extended conductors 20*a* and 20*b* are point-symmetrical with each other about the center of the dielectric layer 16*g*. The extended conductors 18*a*, 18*b*, 20*a*, and 20*b* are formed by applying a conductive paste made of a metal, that is, Cu or Ag, as the main component to the front sides of the dielectric layers 16*c* and 16*g*.

The via-hole conductor v4 passes through the dielectric layer 16*f* in the top-bottom direction and connects the end portion of the extended conductor 20*b* superposed on the downstream end of the sub line portion S3 and the downstream end of the sub line portion S3. With this configuration, the sub line S is connected between the outer electrodes 14*c* and 14*d*. The via-hole conductors v3 and v4 are formed by charging a conductive paste made of a metal, that is, Cu or Ag, as the main component into via-holes formed in the dielectric layer 16*f*.

The ring conductor R1 is disposed on the front half of the front side of the dielectric layer 16*e*, and is formed substantially in a ring-shaped rectangle, as viewed from above. The ring conductor R1 is located such that magnetic flux ϕ1 generated by the main line portion M1 passes through the region surrounded by the ring conductor R1. In the first embodiment, the ring conductor R1 is located such that the center of the main line portion M1 and the center of the sub line portion S1 are positioned within the region surrounded by the ring conductor R1. The center of the ring conductor R1 coincides with the center of the main line portion M1 and the center of the sub line portion S1, as viewed from above. The ring conductor R1 is disposed between the main line portion M1 and the sub line portion S1 in the top-bottom direction.

The ring conductor R2 is disposed on the rear half of the front side of the dielectric layer 16*e*, and is formed substantially in a ring-shaped rectangle, as viewed from above. The ring conductor R2 is located such that magnetic flux ϕ3 generated by the main line portion M3 passes through the region surrounded by the ring conductor R2. In the first embodiment, the ring conductor R2 is located such that the center of the main line portion M3 and the center of the sub line portion S3 are positioned within the region surrounded by the ring conductor R2. The center of the ring conductor R2 coincides with the center of the main line portion M3 and the center of the sub line portion S3, as viewed from above. The ring conductor R2 is disposed between the main line portion M3 and the sub line portion S3 in the top-bottom direction.

The ground conductor 22 is disposed within the multilayer body 12, and is located on a higher level than the main line M, the sub line S, and the extended conductors 18*a*, 18*b*, 20*a*, and 20*b* in the top-bottom direction. More specifically, the ground conductor 22 is formed substantially in a rectangular shape and is disposed such that it covers substantially the entire surface of the front side of the dielectric layer 16*b*. The ground conductor 22 extends to the individual sides of the dielectric layer 16*b* and is connected to the outer electrodes 14*e* through 14*j*.

The ground conductor 24 is disposed within the multilayer body 12 and is located on a lower level than the main line M, the sub line S, ring conductors R1 and R2, and the extended conductors 18*a*, 18*b*, 20*a*, and 20*b* in the top-bottom direction. More specifically, the ground conductor 24 is formed substantially in a rectangular shape and is disposed such that it covers substantially the entire surface of the front side of the dielectric layer 16*h*. The ground conductor 24 extends to the individual sides of the dielectric layer 16*h* and is connected to the outer electrodes 14*e* through 14*j*. The ground conductors 22 and 24 are formed by applying a conductive paste made of a metal, that is, Cu or Ag, as the main component to the front sides of the dielectric layers 16*b* and 16*h*, respectively.

The capacitor conductors 26*a* through 26*d* are disposed within the multilayer body 12 and are located on a lower level than the ground conductor 24 in the top-bottom direction. More specifically, the capacitor conductors 26*a* through 26*d* are substantially rectangular conductor layers disposed on the front side of the dielectric layer 16*i*. The capacitor conductor 26*a* extends to the right long side of the dielectric layer 16*i* and is connected to the outer electrode 14*a*. The capacitor conductor 26*a* opposes the ground conductor 24 with the dielectric layer 16*h* therebetween so as to form a capacitor C1. With this configuration, the capacitor C1 is connected between the outer electrode 14*a* and the outer electrodes 14*e* through 14*j*.

The capacitor conductor 26*b* extends to the left long side of the dielectric layer 16*i* and is connected to the outer electrode 14*b*. The capacitor conductor 26*b* opposes the ground conductor 24 with the dielectric layer 16*h* therebetween so as to form a capacitor C2. With this configuration, the capacitor C2 is connected between the outer electrode 14*b* and the outer electrodes 14*e* through 14*j*.

The capacitor conductor 26*c* extends to the left long side of the dielectric layer 16*i* and is connected to the outer electrode 14*c*. The capacitor conductor 26*c* opposes the ground conductor 24 with the dielectric layer 16*h* therebetween so as to form a capacitor C3. With this configuration, the capacitor C3 is connected between the outer electrode 14*c* and the outer electrodes 14*e* through 14*j*.

The capacitor conductor 26*d* extends to the right long side of the dielectric layer 16*i* and is connected to the outer electrode 14*d*. The capacitor conductor 26*d* opposes the ground conductor 24 with the dielectric layer 16*h* therebetween so as to form a capacitor C4. With this configuration, the capacitor C4 is connected between the outer electrode 14*d* and the outer electrodes 14*e* through 14*j*. The capacitor conductors 26*a* through 26*d* are formed by applying a conductive paste made of a metal, that is, Cu or Ag, as the main component to the front side of the dielectric layer 16*i*.

(Advantages)

By the use of the directional coupler 10*a* configured as described above, it is possible to reduce the degree of coupling between the main line M and the sub line S while a decreased thickness of the directional coupler 10*a* is implemented. This will be discussed more specifically. The directional coupler 10*a* includes the ring conductor R1. The ring conductor R1 is a parasitic element serving in the following manner. The ring conductor R1 receives magnetic flux ϕ1 which is generated by the main line portion M1 when a current flows through the main line portion M1, and then generates magnetic flux ϕ2 passing through the sub line portion S1, due to electromagnetic induction. More specifically, the ring conductor R1 is formed in a ring-like shape, as viewed from above, and the center of the main line portion M1 is positioned within the region surrounded by the ring conductor R1, as viewed from above. With this arrangement, if, for example, the main line portion M1 increases downward magnetic flux ϕ1, the ring conductor R1 increases upward magnetic flux ϕ2. Accordingly, part of the magnetic flux ϕ1 is canceled out with the magnetic flux ϕ2, thereby decreasing the magnetic flux ϕ1 passing through the sub line portion S1. As a result, the degree of coupling between the main line portion M1 and the sub line portion S1 is reduced. The degree of coupling between the main line portion M3 and the sub line portion S3 is also reduced in a similar manner. As described above, in the directional coupler 10*a*, instead of increasing the vertical distance between the main line M and the sub line S, the ring conductors R1 and R2 are disposed so as to reduce the degree of coupling between the main line M and the sub line S. As a result, by the use of the directional coupler 10*a*, it is possible to reduce the degree of coupling between the main line M and the sub line S while a decreased thickness of the directional coupler 10*a* is implemented.

The inventors of this application conducted the following computer simulations to verify the advantages obtained by the directional coupler 10*a*. The inventors fabricated, as a first model, a directional coupler obtained by removing the ring conductors R1 and R2 from the directional coupler 10*a*. The inventors also fabricated the directional coupler 10*a* as a second model. Then, the bandpass characteristics and the coupling characteristics of the first and second models were calculated by using a computer. The bandpass characteristic is represented by the ratio of the power of a high-frequency signal output from the outer electrode 14*b* (output port) to the power of a high-frequency signal input from the outer electrode 14*a* (input port). The coupling characteristics are represented by the ratio of the power of a high-frequency signal output from the outer electrode 14*c* (coupling port) to the power of a high-frequency signal output from the outer electrode 14*b* (output port).

Figure 4A:
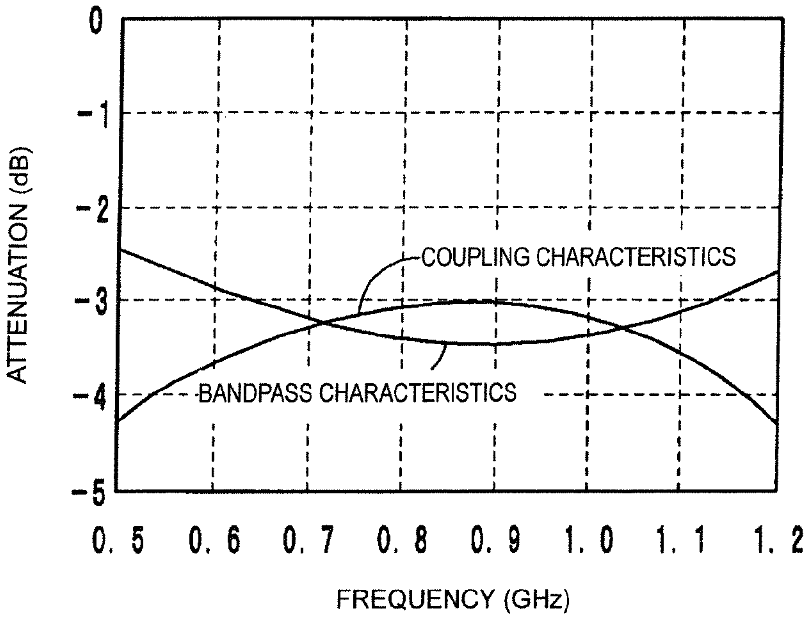
FIGS. 4A and 4B are graphs illustrating simulation results of a first model and a second model, respectively.
Figure 4B:
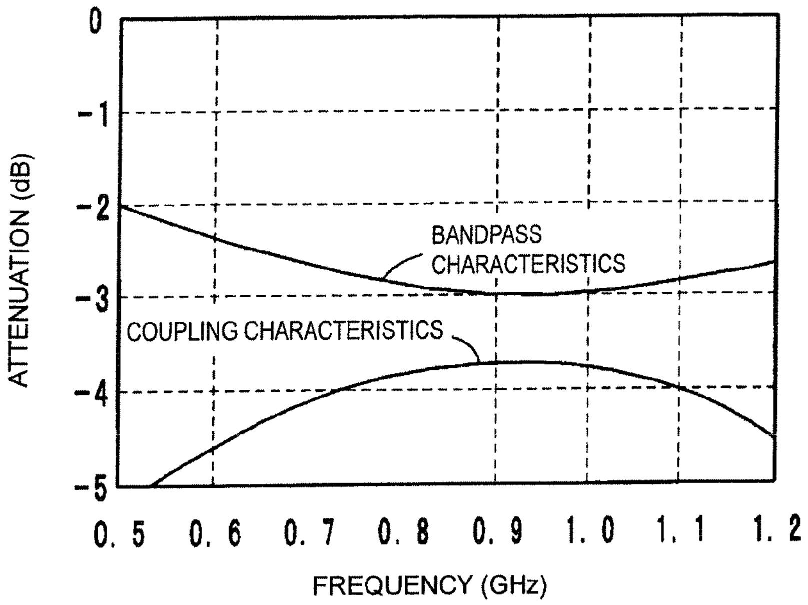

FIG. 4A is a graph illustrating the simulation results of the first model. FIG. 4B is a graph illustrating the simulation results of the second model. In FIGS. 4A and 4B, the vertical axis indicates the attenuation, and the horizontal axis indicates the frequency.

Upon comparing FIGS. 4A and 4B with each other, it is seen that the attenuation of the bandpass characteristics of the second model is smaller than that of the first model. This is because the insertion loss is decreased due to a reduced degree of coupling between the main line M and the sub line S.

FIGS. 4A and 4B also show that the attenuation of the coupling characteristics of the second model is greater than that of the first model. This is because the power of a high-frequency signal output from the outer electrode 14*b* is decreased due to a reduced degree of coupling between the main line M and the sub line S. The above-described computer simulations validate that, by the provision of the ring conductors R1 and R2, the degree of coupling between the main line M and the sub line S is reduced.

The main line M and the sub line S have substantially the same configuration, and are superposed on each other and coincide with each other, as viewed from above. Accordingly, the structure of the main line M and that of the sub line S are similar to each other, and thus, the electrical characteristics, such as the characteristic impedance, of the main line M and those of the sub line S can resemble each other. This makes it possible to reduce the phase difference between a signal output from the outer electrode 14*b* and a signal output from the outer electrode 14*c*. That is, the phase difference characteristics of the directional coupler 10*a* are enhanced.

Since the extended conductors 18*a* and 20*a* have substantially the same length, the resistance and phase change of the extended conductor 18*a* and those of the extended conductor 20*a* are substantially equal to each other. Accordingly, the electrical characteristics, such as the characteristic impedance, between the outer electrodes 14*a* and 14*b* and those between the outer electrodes 14*c* and 14*d* can resemble each other. The phase difference characteristics of the directional coupler 10*a* are also enhanced. The relationships between the extended conductors 18*b* and 20*b* can be explained in a similar manner, and thus, similar advantages can be obtained.

The extended conductors 18*a*, 18*b*, 20*a*, and 20*b* are formed in a linear shape. Accordingly, they can be connected to the outer electrodes with the shortest distance. Thus, the resistance of the extended conductors 18*a*, 18*b*, 20*a*, and 20*b* can be reduced to a small level, thereby suppressing unwanted magnetic coupling or capacitive coupling. As a result, the insertion loss of the directional coupler 10*a* can be reduced.

In the directional coupler 10*a*, the capacitor C1 is disposed between the outer electrode 14*a* and the outer electrodes 14*e* through 14*j*, the capacitor C2 is disposed between the outer electrode 14*b* and the outer electrodes 14*e* through 14*j*, the capacitor C3 is disposed between the outer electrode 14*c* and the outer electrodes 14*e* through 14*j*, and the capacitor C4 is disposed between the outer electrode 14*d* and the outer electrodes 14*e* through 14*j*. With this configuration, by changing the capacitance values of the capacitors C1 through C4, the characteristic impedance between the outer electrodes 14*a* and 14*b* and that between the outer electrodes 14*c* and 14*d* can be adjusted. Thus, the characteristic impedance between the outer electrodes 14*a* and 14*b* and that between the outer electrodes 14*c* and 14*d* can resemble each other, thereby enhancing the phase difference characteristics of the directional coupler 10*a*.

The ground conductor 22 is located on a higher level than the main line M, the sub line S, and the extended conductors 18*a*, 18*b*, 20*a*, and 20*b*. With this arrangement, the noise input from the top side of the directional coupler 10*a* can be blocked by the ground conductor 22, thereby reducing the input of the noise into the main line M, the sub line S, and the extended conductors 18*a*, 18*b*, 20*a*, and 20*b*.

The ground conductor 24 is located on a lower level than the main line M, the sub line S, and the extended conductors 18*a*, 18*b*, 20*a*, and 20*b*. With this arrangement, the noise input from the bottom side of the directional coupler 10*a* can be blocked by the ground conductor 24, thereby reducing the input of the noise into the main line M, the sub line S, and the extended conductors 18*a*, 18*b*, 20*a*, and 20*b*.

The ground conductor 24 is also disposed between the capacitor conductors 26*a* through 26*d* and the main line M, the sub line S, and the extended conductors 18*a*, 18*b*, 20*a*, and 20*b*. This makes it possible to suppress the formation of an unwanted capacitor between the capacitor conductors 26*a* through 26*d* and the main line M, the sub line S, and the extended conductors 18*a*, 18*b*, 20*a*, and 20*b*.

(Second Embodiment)

Figure 5:
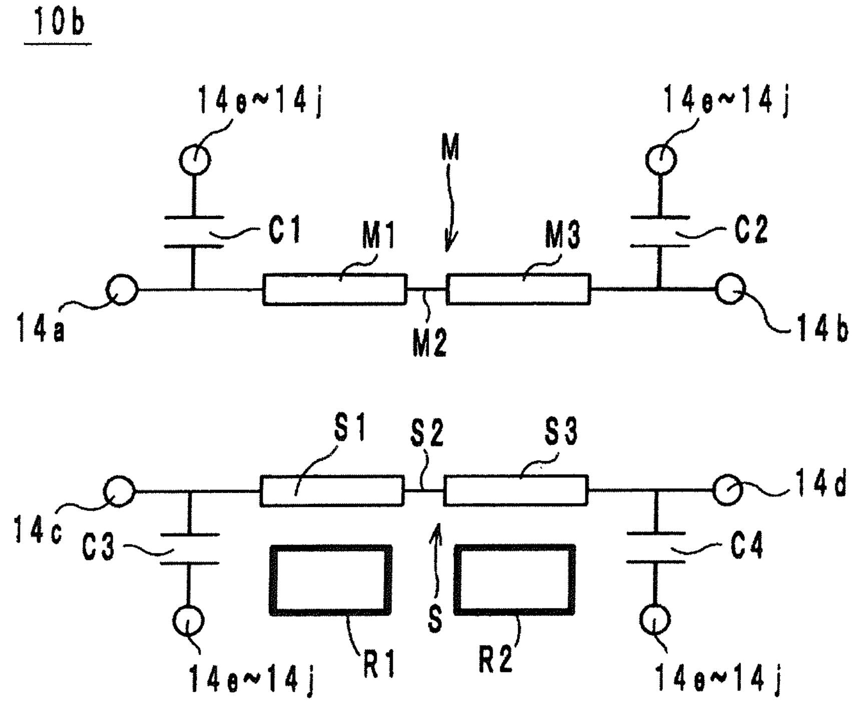
FIG. 5 is an equivalent circuit diagram of a directional coupler according to a second embodiment.
Figure 6:
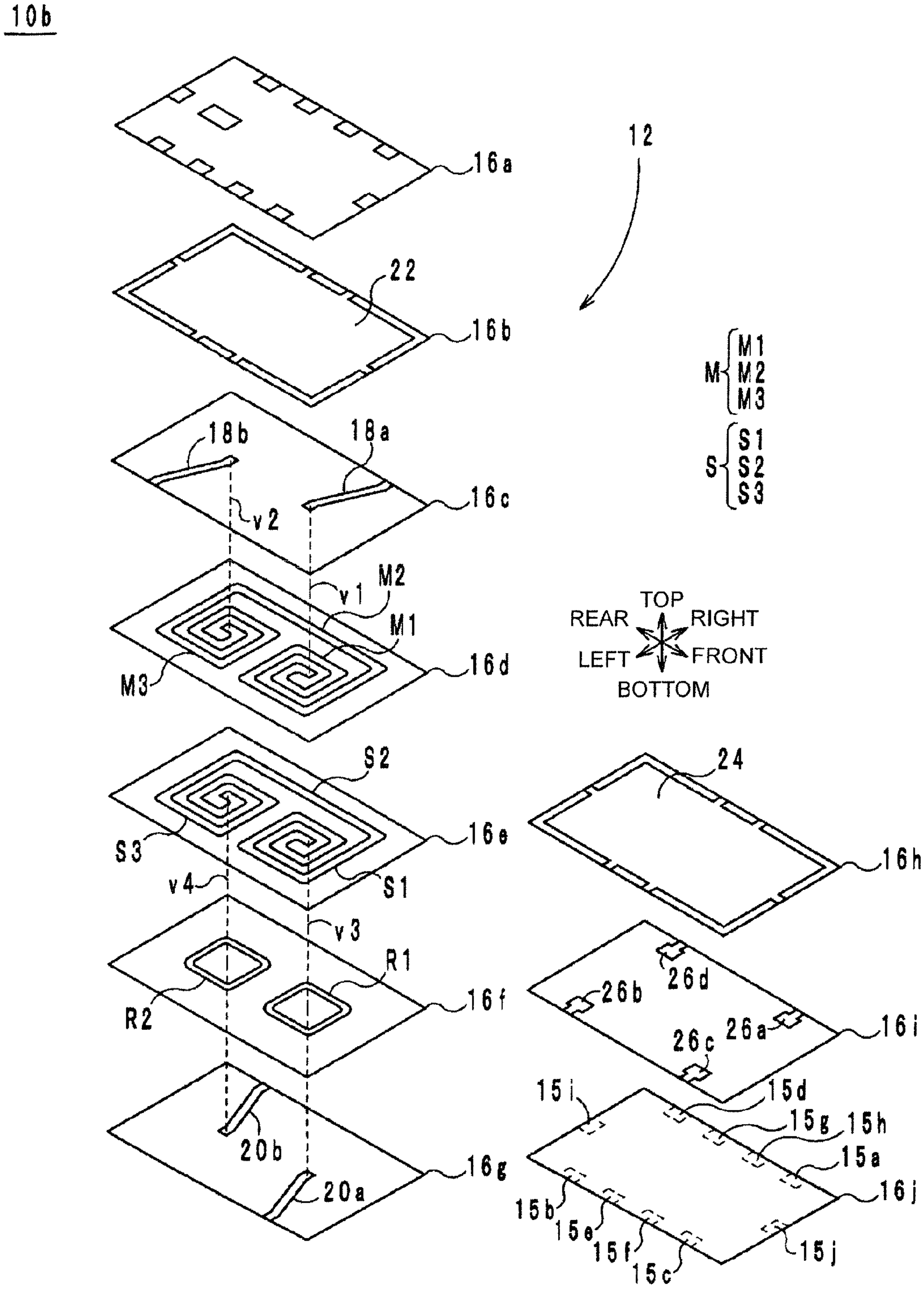
FIG. 6 is an exploded perspective view of a multilayer body of the directional coupler according to the second embodiment.

A directional coupler 10*b* according to a second embodiment will be described below with reference to FIGS. 5 and 6. FIG. 5 is an equivalent circuit diagram of the directional coupler 10*b*. FIG. 6 is an exploded perspective view of a multilayer body 12 of the directional coupler 10*b*. As the external perspective view of the directional coupler 10*b*, FIG. 2 will be used.

As shown in FIGS. 5 and 6, the directional coupler 10*b* is different from the directional coupler 10*a* in the position of the ring conductors R1 and R2. More specifically, in the directional coupler 10*b*, in the top-bottom direction, the ring conductors R1 and R2 are located such that the sub line portions S1 and S3 and the intermediate line portion S2 intervene between the main line portions M1 and M3 and the intermediate line portion M2 and the ring conductors R1 and R2. Accordingly, in the top-bottom direction, the main line portion M1, the sub line portion S1, and the ring conductor R1 are located in this order, and the main line portion M3, the sub line portion S3, and the ring conductor R2 are located in this order. That is, the ring conductors R1 and R2 are disposed on a lower level than the sub line portions S1 and S3 and the intermediate line portion S2 in the top-bottom direction. In the second embodiment, the sub line portions S1 and S3 and the intermediate line portion S2 are disposed on the front side of the dielectric layer 16*e*, and the ring conductors R1 and R2 are disposed on the front side of the dielectric layer 16*f*.

By the use of the directional coupler 10*b* configured as described above, advantages similar to those of the directional coupler 10*a* can be obtained. However, the ring conductors R1 and R2 of the directional coupler 10*b* are located farther away from the main line M than those of the directional coupler 10*a*. Accordingly, magnetic flux ϕ2 generated by the ring conductor R1 and magnetic flux ϕ4 generated by the ring conductor R2 of the directional coupler 10*b* are smaller than those of the directional coupler 10*a*. It is, therefore, less likely that a change in the magnetic flux ϕ1 and a change in the magnetic flux ϕ3 will be canceled out with the magnetic flux ϕ2 and the magnetic flux ϕ4, respectively, in the directional coupler 10*b* than in the directional coupler 10*a*. As a result, the degree of coupling between the main line M and the sub line S in the directional coupler 10*b* is greater than that in the directional coupler 10*a*. By taking this into consideration, one of the directional couplers 10*a* and 10*b* may be selected in accordance with a required degree of coupling.

(Third Embodiment)

Figure 7:
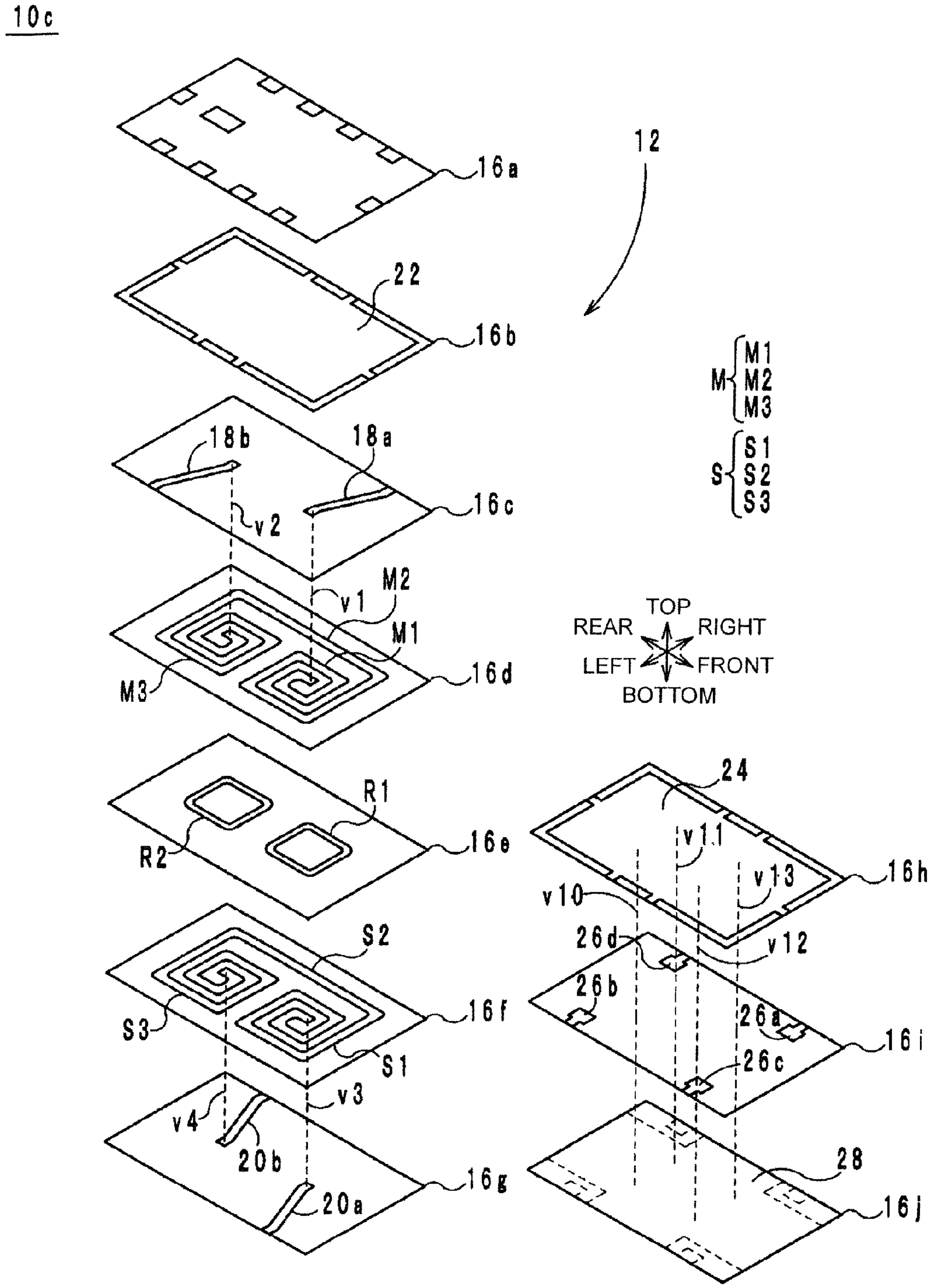
FIG. 7 is an exploded perspective view of a multilayer body of a directional coupler according to a third embodiment.

A directional coupler 10*c* according to a third embodiment will be described below with reference to FIG. 7. FIG. 7 is an exploded perspective view of a multilayer body 12 of the directional coupler 10*c*. The circuit configuration of the directional coupler 10*c* is substantially the same as that of the directional coupler 10*a*, and an explanation thereof will thus be omitted.

The directional coupler 10*c* is different from the directional coupler 10*a* in that a ground conductor 28 and via-hole conductors v10 through v13 are disposed in addition to the components of the directional coupler 10*a*. The directional coupler 10*c* will be described below mainly through discussion of the ground conductor 28 and via-hole conductors v10 through v13.

The ground conductor 28 is disposed at the center of the bottom surface of the multilayer body 12, that is, at the center of the back side of the dielectric layer 16*j*. The ground conductor 28 is formed substantially in a cross shape, and more specifically, it is constituted by a strip-like conductor layer extending in the front-rear direction and passing through the center of the dielectric layer 16*j* and a strip-like conductor layer extending in the right-left direction. The ground conductor 28 extends to the long sides and the short sides of the dielectric layer 16*j* and is connected to the outer electrodes 14*e* through 14*j*. However, the ground conductor 28 is not in contact with the portions of the outer electrodes 14*a* through 14*d* bent to the bottom surface.

The via-hole conductors v10 through v13 pass through the dielectric layers 16*h* through 16*j* in the top-bottom direction, and connect the ground conductors 24 and 28.

By the use of the directional coupler 10*c* configured as described above, advantages similar to those of the directional coupler 10*a* can be obtained.

By the use of the directional coupler 10*c*, high heat dissipation characteristics can be obtained. This will be discussed more specifically. When the directional coupler 10*c* is mounted on a circuit board, the ground conductor 28 is in contact with the circuit board. Since the ground conductor 28 is made of a metal, it has a higher thermal conductivity than the dielectric layer 16*j* made of dielectric ceramic. Accordingly, the heat generated in the directional coupler 10*c* is efficiently conducted to the circuit board via the ground conductor 28. As a result, heat dissipation characteristics of the directional coupler 10*c* are enhanced.

Since the ground conductors 24 and 28 are connected to each other by the via-hole conductors v10 through v13, the ground conductor 24 can be stably maintained at the ground potential.

(Fourth Embodiment)

Figure 8:
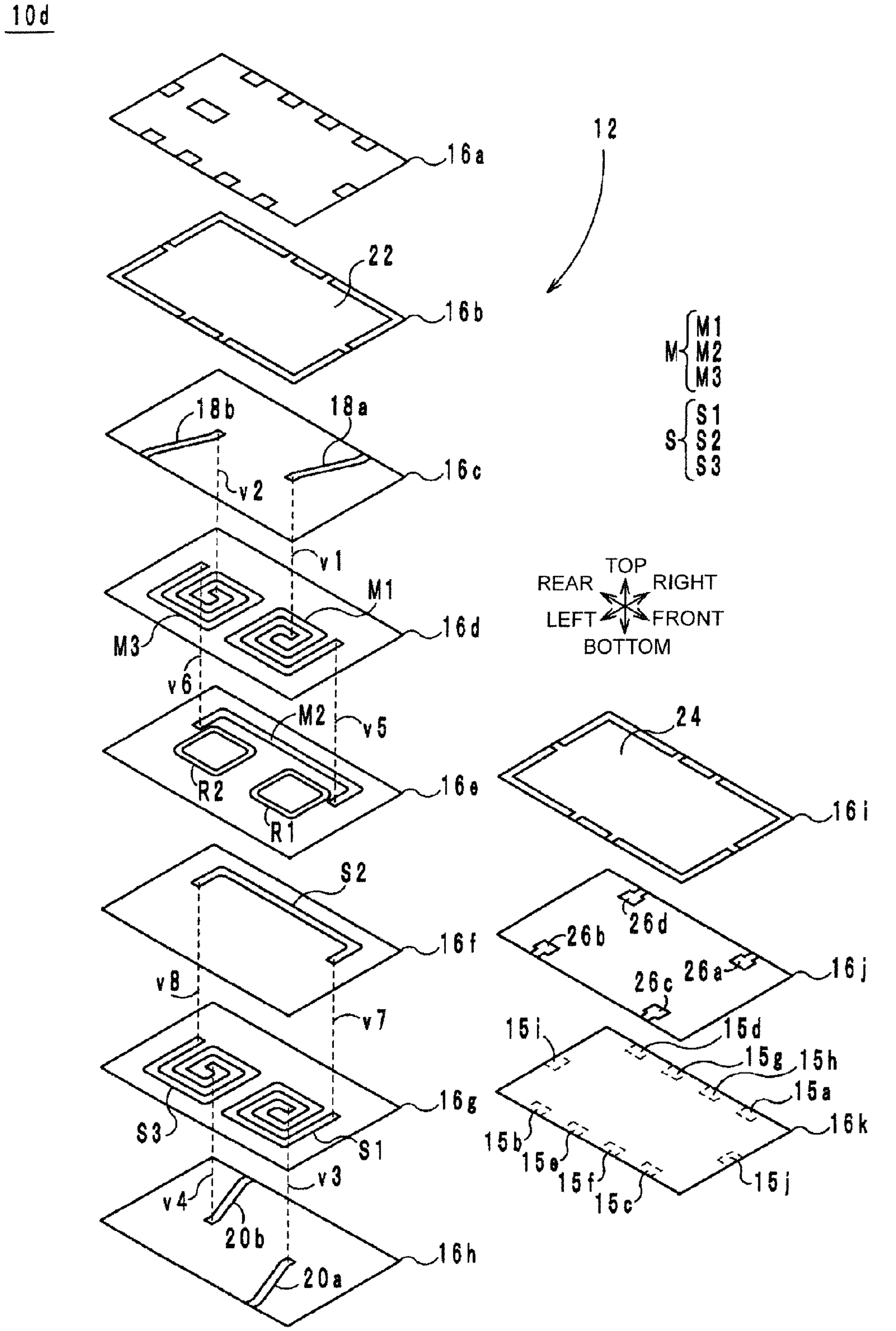
FIG. 8 is an exploded perspective view of a multilayer body of a directional coupler according to a fourth embodiment.

A directional coupler 10*d* according to a fourth embodiment will be described below with reference to FIG. 8. FIG. 8 is an exploded perspective view of a multilayer body 12 of the directional coupler 10*d*. The circuit configuration of the directional coupler 10*d* is substantially the same as that of the directional coupler 10*a*, and an explanation thereof will thus be omitted. As the external perspective view of the directional coupler 10*d*, FIG. 2 will be used.

The directional coupler 10*d* is different from the directional coupler 10*a* in that the intermediate line portion M2 is located at a different position from that of the main line portions M1 and M3 in the top-bottom direction and in that the intermediate line portion S2 is located at a different position from that of the sub line portions S1 and S3 in the top-bottom direction. More specifically, the main line portions M1 and M3 are disposed on the front side of the dielectric layer 16*d*, while the intermediate line portion M2 is disposed on the front side of the dielectric layer 16*e*. The sub line portions S1 and S3 are disposed on the front side of the dielectric layer 16*g*, while the intermediate line portion S2 is disposed on the front side of the dielectric layer 16*f*.

A via-hole conductor v5 passes through the dielectric layer 16*d* in the top-bottom direction and connects the downstream end of the main line portion M1 and the front end portion of the intermediate line portion M2. A via-hole conductor v6 passes through the dielectric layer 16*d* in the top-bottom direction and connects the upstream end of the main line portion M3 and the rear end portion of the intermediate line portion M2.

A via-hole conductor v7 passes through the dielectric layer 16*f* in the top-bottom direction and connects the downstream end of the sub line portion S1 and the front end portion of the intermediate line portion S2. A via-hole conductor v8 passes through the dielectric layer 16*f* in the top-bottom direction and connects the upstream end of the sub line portion S3 and the rear end portion of the intermediate line portion S2.

The ring conductors R1 and R2 are disposed on the front side of the dielectric layer 16*e*.

By the use of the directional coupler 10*d* configured as described above, advantages similar to those of the directional coupler 10*a* can be obtained.

(Fifth Embodiment)

Figure 9:
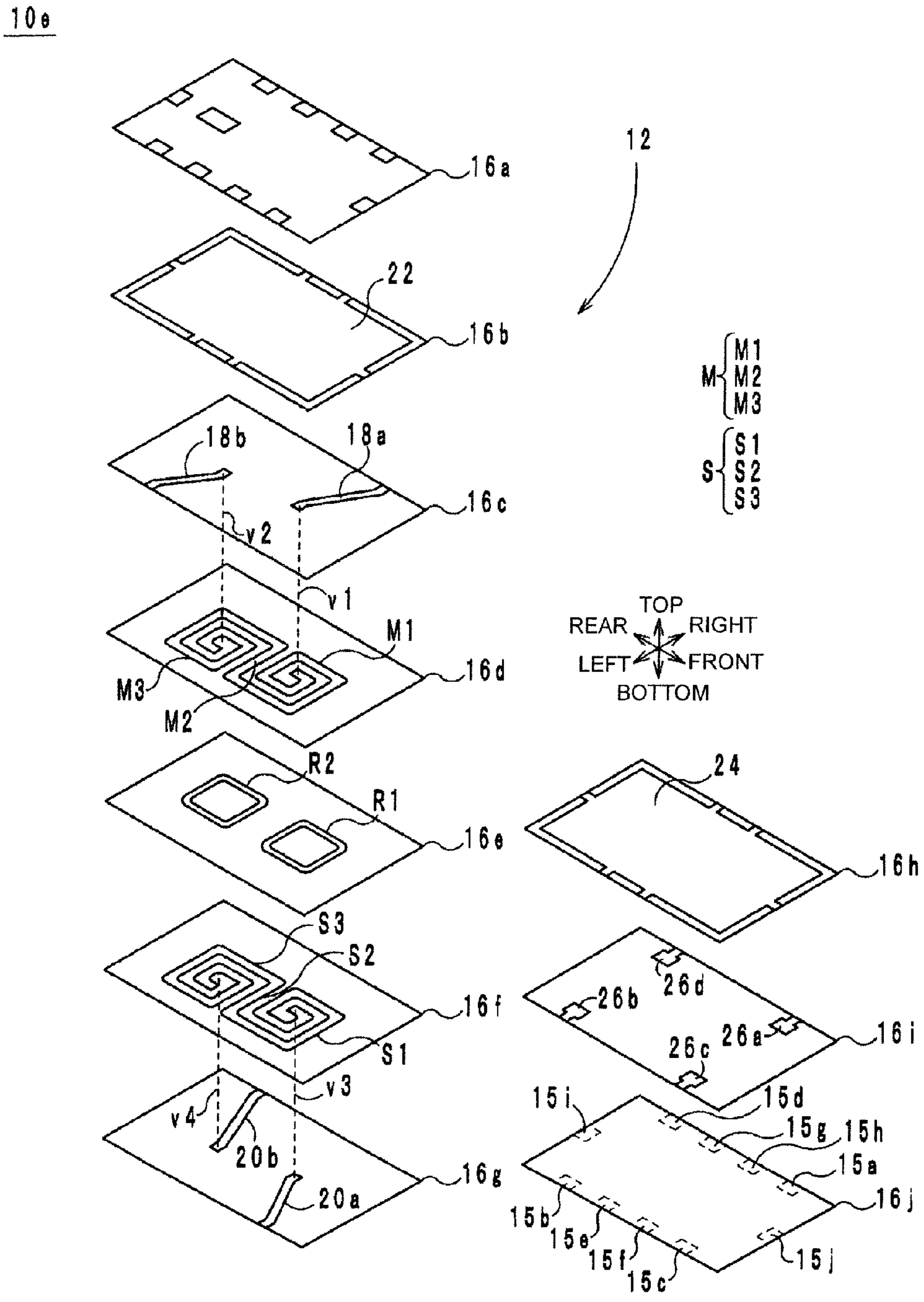
FIG. 9 is an exploded perspective view of a multilayer body of a directional coupler according to a fifth embodiment.

A directional coupler 10*e* according to a fifth embodiment will be described below with reference to FIG. 9. FIG. 9 is an exploded perspective view of a multilayer body 12 of the directional coupler 10*e*. The circuit configuration of the directional coupler 10*e* is substantially the same as that of the directional coupler 10*a*, and an explanation thereof will thus be omitted. As the external perspective view of the directional coupler 10*e*, FIG. 2 will be used.

The directional coupler 10*e* is different from the directional coupler 10*a* in the winding direction of the main line portion M1 and the sub line portion S1. In the directional coupler 10*a*, the main line portion M1 and the sub line portion S1 are formed in a spiral shape moving farther away from the center point while winding around the center point counterclockwise. In contrast, in the directional coupler 10*e*, the main line portion M1 and the sub line portion S1 are formed in a spiral shape moving farther away from the center point while winding around the center point clockwise.

By the use of the directional coupler 10*e* configured as described above, advantages similar to those of the directional coupler 10*a* can be obtained.

(Other Embodiments)

The present disclosure is not restricted to the directional couplers 10*a* through 10*e* of the first through fifth embodiments, and modifications may be made within the spirit of the disclosure.

The configurations of the directional couplers 10*a* through 10*e* may be combined with each other.

In the directional coupler 10*d* of the fourth embodiment, the intermediate line portions M2 and S2 may be located at the same position in the top-bottom direction. That is, the intermediate line portions M2 and S2 may be located on the same dielectric layer. In this case, as viewed from above, the intermediate line portions M2 and S2 are therefore displaced from each other, instead of being superposed on each other as in the directional coupler 10*d*.

In the directional couplers 10*a* through 10*e*, the positions of the ring conductors R1 and R2 may be changed. More specifically, in the top-bottom direction, the ring conductors R1 and R2 may be located such that the main line portions M1 and M3 and the intermediate line portion M2 intervene between the ring conductors R1 and R2 and the sub line portions S1 and S3 and the intermediate line portion S2. That is, the ring conductors R1 and R2 may be disposed on a higher level than the main line portions M1 and M3 and the intermediate line portion M2 in the top-bottom direction.

In the directional coupler 10*d* of the fourth embodiment, the position in the front-rear direction and/or the position in the right-left direction of the intermediate line portion M2 or S2 on the insulating layer may be changed so as to adjust the distance between the intermediate line portion M2 and the intermediate line portion S2. As a result, fine-adjustments may be made to the degree of coupling between the main line M and the sub line S.

In the directional couplers 10*a* through 10*e*, the width of the intermediate line portion M2 and that of the intermediate line portion S2 may be different from each other. Similarly, the width of the main line portion M1 and that of the sub line portion S1 may be different from each other, and the width of the main line portion M3 and that of the sub line portion S3 may be different from each other. In this manner, by changing the widths of the main line portions M1 and M3 and the intermediate line portion M2 and the widths of the sub line portions S1 and S3 and the intermediate line portion S2, the characteristic impedance of the main line M and that of the sub line S can be adjusted.

In the directional couplers 10*a*, 10*b*, 10*d*, and 10*e*, it is preferable that the portions of the outer electrodes 14*a* through 14*d* bent to the bottom surface (hereinafter such portions will be referred to as "bent portions 15*a* through 15*d*" (see FIG. 3)) be smaller than the capacitor conductors 26*a* through 26*d* and be respectively contained within the capacitor conductors 26*a* through 26*d* (not extend to the outside of the capacitor conductors 26*a* through 26*d*), as viewed from above. With this arrangement, it is possible to suppress the formation of an unwanted capacitor between the bent portions 15*a* through 15*d* and the ground conductor 24.

In the directional couplers 10*a* through 10*e*, either one of the main line portions M1 and M3 may not be disposed. In this case, the intermediate line portion M2 is connected to the extended conductor 18*a* or 18*b*. Similarly, either one of the sub line portions S1 and S3 may not be disposed. In this case, the intermediate line portion S2 is connected to the extended conductor 20*a* or 20*b*.

The main line portions M1 and M3 may be disposed on different dielectric layers.

The sub line portions S1 and S3 may be disposed on different dielectric layers.

The configuration of the main line portion M1 and that of the sub line portion S1 may be different from each other. The configuration of the intermediate line portion M2 and that of the intermediate line portion S2 may be different from each other. The configuration of the main line portion M3 and that of the sub line portion S3 may be different from each other.

As described above, preferred embodiments of the present disclosure are suitably used for a directional coupler, and are particularly useful in that it is possible to reduce the degree of coupling between a main line and a sub line of a directional coupler while a decreased thickness of the directional coupler is implemented.

While preferred embodiments of the disclosure have been described above, it is to be understood that variations and modifications will be apparent to those skilled in the art without departing from the scope and spirit of the disclosure. The scope of the invention, therefore, is to be determined solely by the following claims.

What is claimed is:

1. A directional coupler comprising:

a main line including a first main line portion;

a sub line including a first sub line portion electromagnetically coupled with the first main line portion; and a first parasitic element that receives a first magnetic flux generated by the first main line portion when a current flows through the first main line portion and that generates a second magnetic flux passing through the first sub line portion due to electromagnetic induction, wherein the first main line portion is formed substantially in a spiral shape, as viewed from a predetermined direction;

the first sub line portion is formed substantially in a spiral shape, as viewed from the predetermined direction; and a center of the first main line portion and a center of the first sub line portion are located within the region surrounded by the first parasitic element, as viewed from the predetermined direction.

2. The directional coupler according to claim 1, wherein the first parasitic element is formed substantially in a ring-like shape, as viewed from the predetermined direction, and is disposed such that the first magnetic flux passes through a region surrounded by the first parasitic element.

3. The directional coupler according to claim 1, wherein the first parasitic element is disposed between the first main line portion and the first sub line portion in the predetermined direction.

4. The directional coupler according to claim 3, wherein:

the main line further includes a second main line portion that is electrically connected in series with the first main line portion and that is formed substantially in a spiral shape, as viewed from the predetermined direction;

the sub line further includes a second sub line portion that is electrically connected in series with the first sub line portion and that is formed substantially in a spiral shape, as viewed from the predetermined direction;

the second main line portion and the second sub line portion are electromagnetically coupled with each other;

the directional coupler further comprises a second parasitic element that is formed substantially in a ring-like shape, as viewed from the predetermined direction, and that receives a third magnetic flux generated by the second main line portion when a current flows through the second main line portion and generates a fourth magnetic flux passing through the second sub line portion due to electromagnetic induction; and a center of the second main line portion and a center of the second sub line portion are located within a region surrounded by the second parasitic element, as viewed from the predetermined direction.

5. The directional coupler according to claim 4, wherein the second parasitic element is disposed between the second main line portion and the second sub line portion in the predetermined direction.

6. The directional coupler according to claim 5, wherein:

the main line further includes a first intermediate line portion connected between the first and second main line portions; and the first intermediate line portion is disposed at a position different from a position at which the first and second main line portions are disposed in the predetermined direction.

7. The directional coupler according to claim 1, wherein the first main line portion, the first sub line portion, and the first parasitic element are disposed in order of the first main line portion, the first sub line portion, and the first parasitic element in the predetermined direction.

8. The directional coupler according to claim 7, wherein:

the main line further includes a second main line portion that is electrically connected in series with the first main line portion and that is formed substantially in a spiral shape, as viewed from the predetermined direction;

the sub line further includes a second sub line portion that is electrically connected in series with the first sub line portion and that is formed substantially in a spiral shape, as viewed from the predetermined direction;

the second main line portion and the second sub line portion are electromagnetically coupled with each other;

the directional coupler further comprises a second parasitic element that is formed substantially in a ring-like shape, as viewed from the predetermined direction, and that receives a third magnetic flux generated by the second main line portion when a current flows through the second main line portion and generates a fourth magnetic flux passing through the second sub line portion due to electromagnetic induction; and a center of the second main line portion and a center of the second sub line portion are located within a region surrounded by the second parasitic element, as viewed from the predetermined direction.

9. The directional coupler according to claim 8, wherein the second parasitic element is disposed between the second main line portion and the second sub line portion in the predetermined direction.

10. The directional coupler according to claim 9, wherein:

the main line further includes a first intermediate line portion connected between the first and second main line portions; and the first intermediate line portion is disposed at a position different from a position at which the first and second main line portions are disposed in the predetermined direction.

11. The directional coupler according to claim 1, wherein the first sub line portion, the first main line portion, and the first parasitic element are disposed in order of the first sub line portion, the first main line portion, and the first parasitic element in the predetermined direction.

12. The directional coupler according to claim 11, wherein:

the main line further includes a second main line portion that is electrically connected in series with the first main line portion and that is formed substantially in a spiral shape, as viewed from the predetermined direction;

the sub line further includes a second sub line portion that is electrically connected in series with the first sub line portion and that is formed substantially in a spiral shape, as viewed from the predetermined direction;

the second main line portion and the second sub line portion are electromagnetically coupled with each other;

the directional coupler further comprises a second parasitic element that is formed substantially in a ring-like shape, as viewed from the predetermined direction, and that receives a third magnetic flux generated by the second main line portion when a current flows through the second main line portion and generates a fourth magnetic flux passing through the second sub line portion due to electromagnetic induction; and a center of the second main line portion and a center of the second sub line portion are located within a region surrounded by the second parasitic element, as viewed from the predetermined direction.

13. The directional coupler according to claim 12, wherein the second parasitic element is disposed between the second main line portion and the second sub line portion in the predetermined direction.

14. The directional coupler according to claim 13, wherein:

the main line further includes a first intermediate line portion connected between the first and second main line portions; and the first intermediate line portion is disposed at a position different from a position at which the first and second main line portions are disposed in the predetermined direction.

15. The directional coupler according to claim 1, wherein:

the main line further includes a second main line portion that is electrically connected in series with the first main line portion and that is formed substantially in a spiral shape, as viewed from the predetermined direction;

the sub line further includes a second sub line portion that is electrically connected in series with the first sub line portion and that is formed substantially in a spiral shape, as viewed from the predetermined direction;

the second main line portion and the second sub line portion are electromagnetically coupled with each other;

the directional coupler further comprises a second parasitic element that is formed substantially in a ring-like shape, as viewed from the predetermined direction, and that receives a third magnetic flux generated by the second main line portion when a current flows through the second main line portion and generates a fourth magnetic flux passing through the second sub line portion due to electromagnetic induction; and a center of the second main line portion and a center of the second sub line portion are located within a region surrounded by the second parasitic element, as viewed from the predetermined direction.

16. The directional coupler according to claim 15, wherein the second parasitic element is disposed between the second main line portion and the second sub line portion in the predetermined direction.

17. The directional coupler according to claim 16, wherein:

the main line further includes a first intermediate line portion connected between the first and second main line portions; and the first intermediate line portion is disposed at a position different from a position at which the first and second main line portions are disposed in the predetermined direction.

18. The directional coupler according to claim 15, wherein:

the main line further includes a first intermediate line portion connected between the first and second main line portions; and the first intermediate line portion is disposed at a position different from a position at which the first and second main line portions are disposed in the predetermined direction.

19. The directional coupler according to claim 18, wherein:

the sub line further includes a second intermediate line portion connected between the first and second sub line portions;

the second intermediate line portion is disposed at a position different from a position at which the first and second sub line portions are disposed in the predetermined direction; and the first and second intermediate line portions are disposed at the same position in the predetermined direction.

* * * * *